United States Patent
Shi et al.

(10) Patent No.: US 8,499,263 B1
(45) Date of Patent: Jul. 30, 2013

(54) ENCRYPTED PROFILES FOR PARASITIC EXTRACTION

(75) Inventors: Weiping Shi, College Station, TX (US); Wangqi Qiu, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/434,788

(22) Filed: Mar. 29, 2012

(51) Int. Cl.
*G06F 17/50* (2006.01)

(52) U.S. Cl.
USPC ........... 716/100; 716/101; 716/110; 716/118; 716/119

(58) Field of Classification Search
USPC ....... 716/100–101, 110, 118–119; 726/26–27
See application file for complete search history.

(56) References Cited

U.S. PATENT DOCUMENTS

| | | | |
|---|---|---|---|
| 6,086,630 A * | 7/2000 | Williams et al. | 716/119 |
| 2004/0081899 A1* | 4/2004 | Misaka | 430/5 |
| 2008/0028345 A1* | 1/2008 | Suri et al. | 716/2 |
| 2008/0127028 A1* | 5/2008 | Rittman | 716/19 |
| 2008/0216026 A1* | 9/2008 | Gotou | 716/2 |
| 2010/0138801 A1* | 6/2010 | Matsuoka et al. | 716/6 |
| 2010/0174985 A1* | 7/2010 | Levy et al. | 715/244 |
| 2011/0119645 A1* | 5/2011 | Koizumi | 716/102 |
| 2012/0079440 A1* | 3/2012 | Akar et al. | 716/106 |
| 2012/0079442 A1* | 3/2012 | Akar et al. | 716/112 |

OTHER PUBLICATIONS

IR. L. M. Dang and N. Shigyo, "Coupling capacitances for two dimensional wires," IEEE Electron Device Letters EDL-2 (8) pp. 196-197, 1981.
William H. Kao, Mark Basel, "Parasitic Extraction: Current State of the Art and Future Trends", Proceedings of the IEEE, vol. 89, No. 5, May 2001.
P. E. Cottrell and E. M. Buturla, "VLSI wiring capacitance," IBM J. Res. Develop. 29(3) pp. 277-288, 1985.
K. Nabors and J. White, "FastCap: A Multipole Accelerated 3-d Capacitance Extraction Program," IEEE Trans. on CAD, pp. 1447-1459, 1991.

* cited by examiner

*Primary Examiner* — Stacy Whitmore

(57) ABSTRACT

Aspects of the invention relate to techniques for generating encrypted profiles for layout features. According to various implementations of the invention, a layout feature is partitioned into subdomains. The subdomains are associated with boundary nodes and internal nodes. Based on layout design and process profile data for the layout feature, a first electric parameter relationship is determined for the boundary nodes and the internal nodes. An encrypted profile for the layout feature is then generated by converting the first electric parameter relationship into a second electric parameter relationship involving the boundary nodes. The encrypted profile may be used for extracting parasitic parameters associated with the layout feature.

19 Claims, 7 Drawing Sheets

Flow chart
700

ENCRYPTED PROFILES FOR PARASITIC EXTRACTION

FIELD OF THE INVENTION

The present invention relates to the field of integrated circuit (IC) design and process technology. Various implementations of the invention may be particularly useful for generating encrypted profiles that can be used for parasitic extraction.

BACKGROUND OF THE INVENTION

Parasitic capacitance, resistance and inductance effects are becoming more pronounced with the advent of deep submicron process technologies. Even though the processing technology advancements in copper interconnect and low-k dielectric materials reduce parasitic resistance and capacitance, the need to accurately account for parasitic effects is growing as circuit speeds and density continue to increase. Parasitic extraction generates circuit models and plays an important role in various aspects of physical verification such as timing, signal noise, substrate noise, and power grid analysis.

Figure 1A:
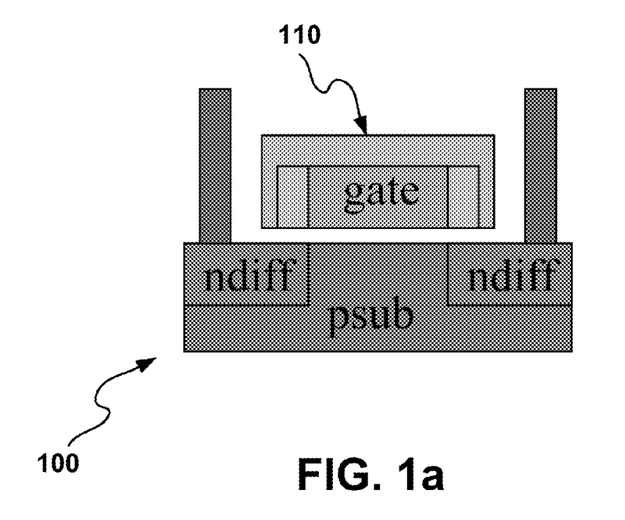
FIG. 1*a* illustrates an example of an original layout design and a process profile for a transistor.
Figure 1B:
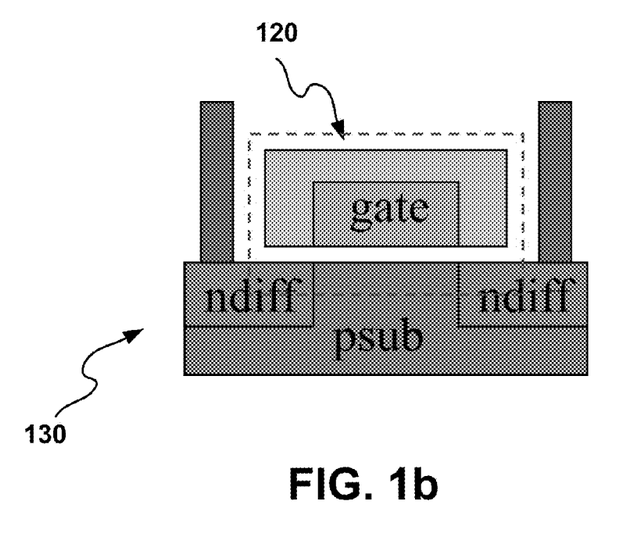
FIG. 1*b* illustrates an example of a simplified electrically equivalent model for the gate of the transistor shown in FIG. 1*a*.

Parasitic extraction requires solving some form of Maxwell's equations with layout design and process profile data. Semiconductor manufacturers, however, usually do not want to supply original layout design and process profile data for devices such as transistors due to the risk of disclosing their proprietary technologies. To facilitate parasitic extraction, electrically equivalent models for devices are usually provided instead. FIG. 1*a* illustrates an example of cross section of a transistor design. The process for fabricating the gate 110 of the transistor 100 may be inferred from the corresponding layout design and process profile data. FIG. 1*b* illustrates an example of cross section of an electrically equivalent model 120 for the gate 110 shown in FIG. 1*a*. Even though the model 120 has a different structure compared to the gate 110, the transistor 130 approximates the electrical characteristics of the transistor 100 and thus can be used to replace the transistor 100 in circuits for extracting parasitic circuit models.

The electrically equivalent model illustrated in FIG. 1*b* is a simplified electrically equivalent model obtained in part by changing the dielectric constant values. While particularly useful in some situations, a simplified electrically equivalent model may not meet the requirement of high-accuracy parasitic extraction. This is especially true in the advanced technology modes. It is thus desirable to search for techniques that can generate more accurate electrically equivalent models for devices or layout features.

BRIEF SUMMARY OF THE INVENTION

Aspects of the invention relate to techniques for generating encrypted profiles for layout features. According to various implementations of the invention, a layout feature is partitioned into a plurality of subdomains. The layout feature may comprise one or more geometric elements corresponding to a portion of or a whole of a device. The device may be, for example, a transistor. The portion of the transistor may be the gate portion. The plurality of subdomains are associated with boundary nodes and internal nodes. The boundary nodes comprise points on boundary of the layout feature and points on conductors inside the boundary of the layout feature while the internal nodes are points inside the boundary of the layout feature.

Based on layout design and process profile data for the layout feature, a first model is generated to describe a first electric parameter relationship involving the boundary nodes and the internal nodes. Various approached may be employed to generate the first model such as the finite element method and the finite difference method. If the finite difference method is used, the first model may be referred to as a finite difference method model.

Based on the first model, a second model is generated to describe a second electric parameter relationship involving the boundary nodes. The second model and location information of the boundary nodes may then be outputted as an encrypted profile for the layout feature.

In some embodiments of the invention, the first electric parameter relationship and the second electric parameter relationship are relationships of electric field flux vs. electric potential.

If the finite difference method is used for generating the first model, the second model may also be referred to as a finite difference method model.

The encrypted profile for the layout feature may be used in a parasitic extraction process to extract one or more parasitic parameters associated with the layout feature. The one or more parasitic parameters may comprise parasitic capacitance, parasitic resistance, parasitic inductance, or any combination thereof.

DETAILED DESCRIPTION OF THE INVENTION

General Considerations

Various aspects of the present invention relate to generating encrypted profiles for layout features. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "partition," "generate" and "associate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 2. This operating environment is only one example of a suitable operating environment, however, and is not intended to suggest any limitation as to the scope of use or functionality of the invention.

Figure 2:
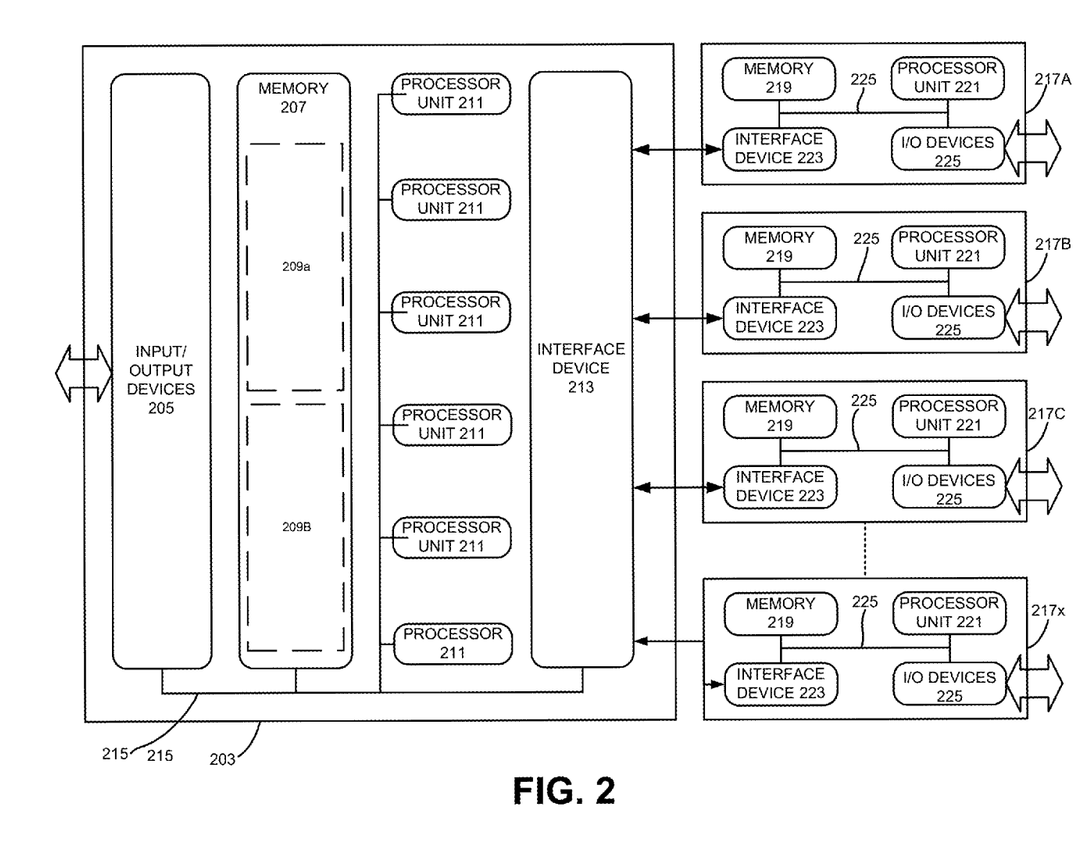
FIG. 2 illustrates an example of a computing system that may be used to implement various embodiments of the invention.

In FIG. 2, the computer network 201 includes a master computer 203. In the illustrated example, the master computer 203 is a multi-processor computer that includes a plurality of input and output devices 205 and a memory 207. The input and output devices 205 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 207 may similarly be implemented using any combination of computer readable media that can be accessed by the master computer 203. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 203 runs a software application for performing one or more operations according to various examples of the invention. Accordingly, the memory 207 stores software instructions 209A that, when executed, will implement a software application for performing one or more operations. The memory 207 also stores data 209B to be used with the software application. In the illustrated embodiment, the data 209B contains process data that the software application uses to perform the operations, at least some of which may be parallel.

The master computer 203 also includes a plurality of processor units 211 and an interface device 213. The processor units 211 may be any type of processor device that can be programmed to execute the software instructions 209A, but will conventionally be a microprocessor device. For example, one or more of the processor units 211 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 211 may be a custom-manufactured processor, such as a microprocessor designed to optimally perform specific types of mathematical operations. The interface device 213, the processor units 211, the memory 207 and the input/output devices 205 are connected together by a bus 215.

Figure 3:
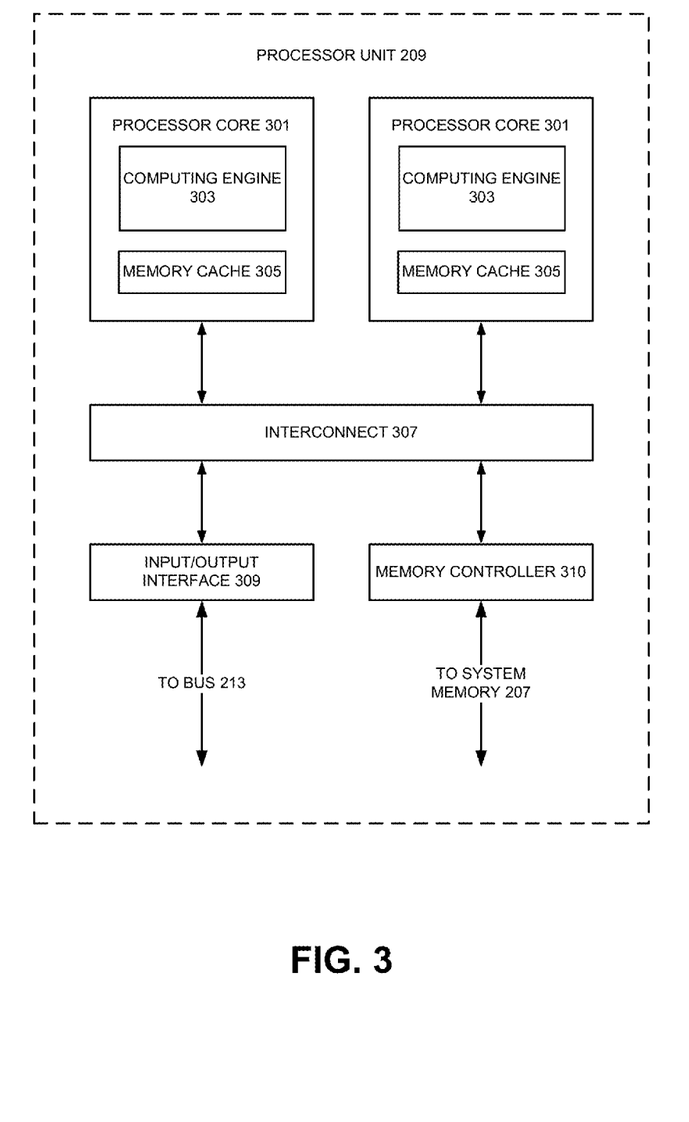
FIG. 3 illustrates an example of a multi-core processor unit that may be used to implement various embodiments of the invention.

With some implementations of the invention, the master computing device 203 may employ one or more processing units 211 having more than one processor core. Accordingly, FIG. 3 illustrates an example of a multi-core processor unit 211 that may be employed with various embodiments of the invention. As seen in this figure, the processor unit 211 includes a plurality of processor cores 301. Each processor core 301 includes a computing engine 303 and a memory cache 305. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 303 may then use its corresponding memory cache 305 to quickly store and retrieve data and/or instructions for execution.

Each processor core 301 is connected to an interconnect 307. The particular construction of the interconnect 307 may vary depending upon the architecture of the processor unit 301. With some processor cores 301, such as the Cell microprocessor created by Sony Corporation, Toshiba Corporation and IBM Corporation, the interconnect 307 may be implemented as an interconnect bus. With other processor units 301, however, such as the Opteron™ and Athlon™ dual-core processors available from Advanced Micro Devices of Sunnyvale, Calif., the interconnect 307 may be implemented as a system request interface device. In any case, the processor cores 301 communicate through the interconnect 307 with an input/output interface 309 and a memory controller 311. The input/output interface 309 provides a communication interface between the processor unit 301 and the bus 215. Similarly, the memory controller 311 controls the exchange of information between the processor unit 301 and the system memory 207. With some implementations of the invention, the processor units 301 may include additional components, such as a high-level cache memory accessible shared by the processor cores 301.

While FIG. 3 shows one illustration of a processor unit 301 that may be employed by some embodiments of the invention, it should be appreciated that this illustration is representative only, and is not intended to be limiting. For example, some embodiments of the invention may employ a master computer 203 with one or more Cell processors. The Cell processor employs multiple input/output interfaces 309 and multiple memory controllers 311. Also, the Cell processor has nine different processor cores 301 of different types. More particularly, it has six or more synergistic processor elements (SPEs) and a power processor element (PPE). Each synergistic processor element has a vector-type computing engine 303 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 211 can be used in lieu of multiple, separate processor units 211. For example, rather than employing six separate processor units 211, an alternate implementation of the invention may employ a single processor unit 211 having six cores, two multi-core processor units each having three cores, a multi-core processor unit 211 with four cores together with two separate single-core processor units 211, etc.

Returning now to FIG. 2, the interface device 213 allows the master computer 203 to communicate with the servant computers 217A, 217B, 217C . . . 217x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 213 translates data and control signals from the master computer 203 and each of the servant computers 217 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 217 may include a memory 219, a processor unit 221, an interface device 223, and, optionally, one more input/output devices 225 connected together by a system bus 227. As with the master computer 203, the optional input/output devices 225 for the servant computers 217 may include any conventional input or output devices, such as keyboards, pointing devices, microphones, display monitors, speakers, and printers. Similarly, the processor units 221 may be any type of conventional or custom-manufactured programmable processor device. For example, one or more of the processor units 221 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 221 may be custom-manufactured processors, such as microprocessors designed to optimally perform specific types of mathematical operations. Still further, one or more of the processor units 221 may have more than one core, as described with reference to FIG. 3 above. For example, with some implementations of the invention, one or more of the processor units 221 may be a Cell processor. The memory 219 then may be implemented using any combination of the computer readable media discussed above. Like the interface device 213, the interface devices 223 allow the servant computers 217 to communicate with the master computer 203 over the communication interface.

In the illustrated example, the master computer 203 is a multi-processor unit computer with multiple processor units 211, while each servant computer 217 has a single processor unit 221. It should be noted, however, that alternate implementations of the invention may employ a master computer having single processor unit 211. Further, one or more of the servant computers 217 may have multiple processor units 221, depending upon their intended use, as previously discussed. Also, while only a single interface device 213 or 223 is illustrated for both the master computer 203 and the servant computers, it should be noted that, with alternate embodiments of the invention, either the computer 203, one or more of the servant computers 217, or some combination of both may use two or more different interface devices 213 or 223 for communicating over multiple communication interfaces.

With various examples of the invention, the master computer 203 may be connected to one or more external data storage devices. These external data storage devices may be implemented using any combination of computer readable media that can be accessed by the master computer 203. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 217 may alternately or additionally be connected to one or more external data storage devices. Typically, these external data storage devices will include data storage devices that also are connected to the master computer 203, but they also may be different from any data storage devices accessible by the master computer 203.

It also should be appreciated that the description of the computer network illustrated in FIG. 2 and FIG. 3 is provided as an example only, and it not intended to suggest any limitation as to the scope of use or functionality of alternate embodiments of the invention.

Parasitic Extraction And Maxwell's Equations

As previously noted, various embodiments of the invention are related to parasitic extraction. Parasitic extraction usually involves solving some form of Maxwell's equations because electromagnetic behavior is governed by Maxwell's equations. Analytic formulas for simple or simplified geometry can be used where accuracy is less important than speed, but when the geometric configuration is not simple and accuracy demands do not allow simplification, numerical solution of an appropriate form of Maxwell's equations need to be employed.

Many methods employ either a differential form of or an integral form of Maxwell's equations. In these methods, the whole domain in which the electromagnetic fields reside is discretized or partitioned into a plurality of subdomains. Some of the most common approaches are the finite difference method, the finite volume method, the finite element method and the boundary element method. These methods transform the differential form or the integral form of Maxwell's equations into a linear algebraic system. Various linear solution methods, such as direct factorization, iteration, or multigrid methods, can be used to solve the linear algebraic system.

To help illustrate various implementations of the invention, the finite difference method is discussed in detail below. It should be appreciated, however, that the invention is not limited to methods, systems or products associated only with the finite difference method. A person of ordinary skill in the art would understand either the finite element method or the finite volume method may be used in various embodiments of the invention since the finite difference method may be considered as a special case of the finite element method and the finite volume method. Moreover, various implementations of the invention may use other methods such as the boundary element method.

Finite Difference Method And Encrypted Electrically Equivalent Model

Most parasitic extraction problems do not require solving the full set of Maxell's equations. The parasitic capacitance problem, for example, is to find the relation between charge and potential for a set of conductors: Q=CV, where C is the capacitance matrix, V is the vector of conductor potential, and Q is the vector of conductor charge. A column i of the matrix C can be determined by computing the charge on all conductors when conductor i is set to 1 volt and the rest to zero volt.

The charge Q on a conductor may be computed from the electric potential $\Phi(r)$. The Laplace equation for the potential $\Phi(r)$ is related to the charge Q by:

$$\nabla^2 \Phi(r) = Q \quad [1]$$

Accordingly, the extraction of parasitic capacitance centers on solving the Laplace equation.

The finite difference method may be employed to numerically solve the Laplace equation. In solving the Laplace equation, the finite difference method first partitions the domain (space) into a plurality of subdomains such as rectangles (including squares) in two-dimensional cases and rectangular boxes (including cubes) in three-dimensional cases. The partition forms a grid. The electric potential at each grid point (node) is either given if the grid is on a conductor, or is unknown if the grid is on a dielectric. This transforms the Laplace equation into a linear equation system:

$$A \begin{pmatrix} V_d \\ V_c \end{pmatrix} = \begin{pmatrix} 0 \\ Q_c \end{pmatrix} \quad [2]$$

where A is a sparse matrix and $V_d$ is an unknown vector of electric potentials for grid points (nodes) at dielectric, $V_c$ is a given vector of electric potentials for conductors, and $Q_c$ is a unknown vector of charges on the conductor mesh nodes. This linear system can be rewritten as:

$$\begin{bmatrix} A_{11} & A_{12} \\ A_{21} & A_{22} \end{bmatrix} \begin{bmatrix} V_d \\ V_c \end{bmatrix} = \begin{bmatrix} 0 \\ Q_c \end{bmatrix} \quad [3]$$

Since $V_c$ is given, only $A_{11}V_d = A_{12}V_c$ needs to be solved. Then the capacitance can be derived from Gauss's Law or from $Q_c = A_{21}V_d + A_{22}V_c$.

Figure 4:
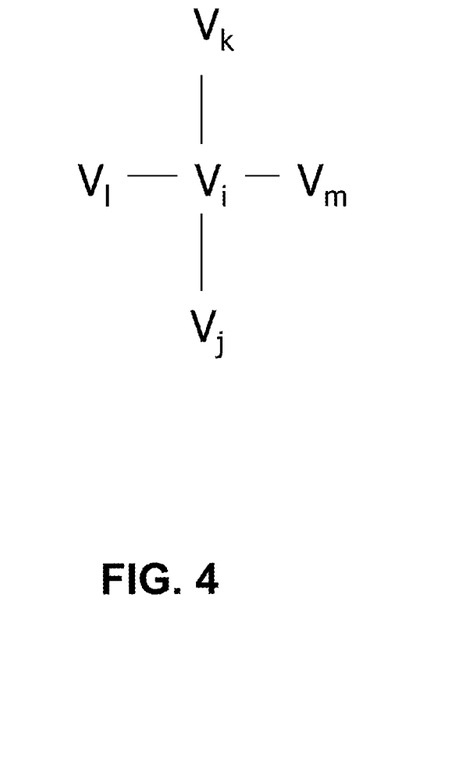
FIG. 4 illustrates an example of a portion of a two-dimensional grid formed by partitioning.

FIG. 4 illustrates an example of a portion of a two-dimensional grid formed by partition. In the figure, $v_i$, $v_j$, $v_k$, $v_l$ and $v_m$ represent electric potentials for nodes at $(x_i, y_i)$, $(x_j, y_j)$, $(x_k, y_k)$, $(x_l, y_l)$ and $(x_m, y_m)$, respectively. For the node at $(x_i, y_i)$, the left hand side of the Laplace equation becomes:

$$\frac{\partial^2 \Phi}{\partial x^2} + \frac{\partial^2 \Phi}{\partial y^2} = \frac{\frac{v_m - v_i}{x_m - x_i} - \frac{v_i - v_l}{x_i - x_l}}{0.5((x_m - x_i) + (x_i - x_l))} + \frac{\frac{v_k - v_i}{y_k - y_i} - \frac{v_i - v_j}{y_i - y_j}}{0.5((y_k - y_i) + (y_i - y_j))} \quad [4]$$

where the relative dielectric permittivity is assumed to be 1. Similar equations can be obtained for other nodes. All these equations along with equations for the rest of nodes in the whole domain form a linear equation system. The matrix A in Eq. 2 can then be constructed.

As illustrated above, to construct the matrix A in Eq. 2, the geometric parameters and dielectric or conductor information need to be extracted from layout design and process profile data. However, such information contains the process and design information which semiconductor manufacturers are reluctant to disclose. Therefore, with various implementations of the invention, an encrypted model may be generated for a whole of or a portion of a device or a layout feature and can be used for solving the Laplace equation with little or no effects on accuracy requirement. The encrypted model describes relationships among some electrical parameters for the whole of or the portion of the device but hides the original structure.

Figure 5:
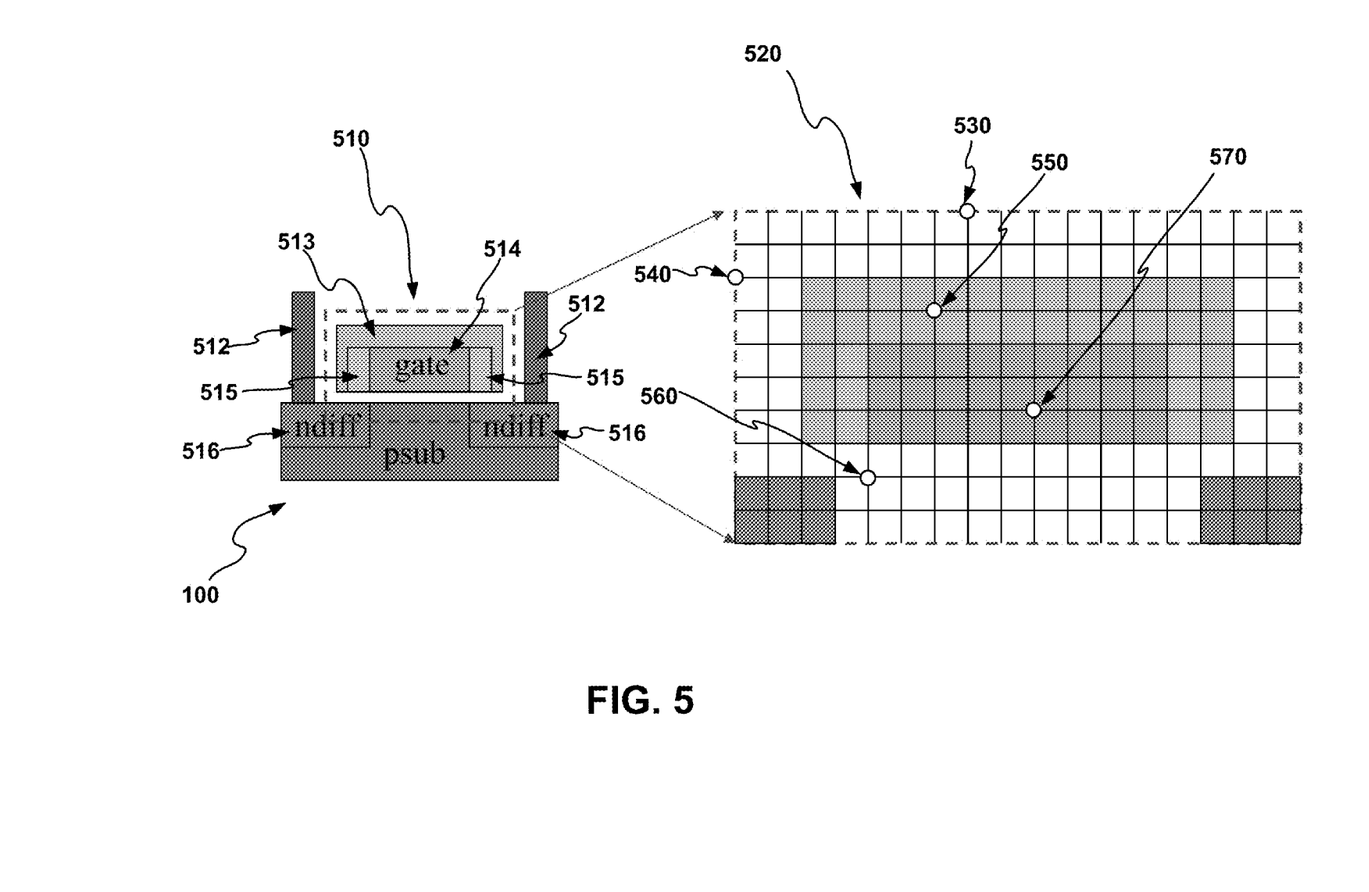
FIG. 5 illustrates an example of generating, for the gate portion of the transistor shown in FIG. 1*a*, an electrically equivalent model according to various embodiments of the invention.

FIG. 5 illustrates an example of generating an encrypted model for the gate portion of the transistor 100 shown in FIG. 1a. In this transistor, the gate (514), diffusion (516), and contact (512) parts are conductors. The other parts including 513 and 515 are dielectrics. The gate portion 510 is partitioned using a grid 520. The boundary grid points such as 530 and 540 are referred to as boundary nodes. The internal grid points on dielectrics such as 550 and 560 are referred to as internal nodes. For each conductor entirely within the boundary, one or more points on each conductor, such as 570, are also referred to as boundary nodes. Electric potentials at the internal nodes and the boundary nodes may be represented by vectors X and Y, respectively. The electric flux at the boundary nodes $E = (e_1, e_2, \ldots)$ may be represented by:

$$\begin{bmatrix} A_{11} & A_{12} \\ A_{21} & A_{22} \end{bmatrix} \begin{bmatrix} X \\ Y \end{bmatrix} = \begin{bmatrix} 0 \\ E \end{bmatrix} \quad [5]$$

Eq. 5 can be transformed to:

$$E = (A_{22} - A_{21}A_{11}^{-1}A_{12})Y \quad [6]$$

In Eq. 6, the electric flux values at the boundary nodes are dependent only on the electric potential values at the boundary nodes while the effects of the electric potentials at the internal nodes are included in the term $A_{21}A_{11}^{-1}A_{12}$. This term $A_{21}A_{11}^{-1}A_{12}$ reflects the relationship between the electric potentials at the boundary nodes and at the internal nodes.

Rather than disclosing detailed structure information of the gate portion 510, semiconductor manufacturers may supply only ($A_{22}-A_{21}A_{11}^{-1}A_{12}$) and coordinates of the boundary nodes as an encrypted electrically equivalent model (or profile) for parasitic extraction. The coordinates of boundary grid points representing conductors entirely inside of boundary do not need to be disclosed. A parasitic process using the electrically equivalent model may comprise the following steps: 1) solving the regions outside the gate portion 510; 2) determining electric field flux values at the boundary nodes using Eq. 6; and 3) forcing initial electric flux at the boundary nodes to the determined values and go back to step 1).

While the above illustration uses capacitance extraction as an example, a person of skill in the art would appreciate that the invention are applicable to other parasitic extraction such as resistance extraction. As noted before, the invention is also not limited to the finite difference method. Other methods such as the finite element method and the finite volume method can use unrealizable models generated by various embodiments of the invention.

Encrypted Profile Generation Tools And Methods

Figure 6:
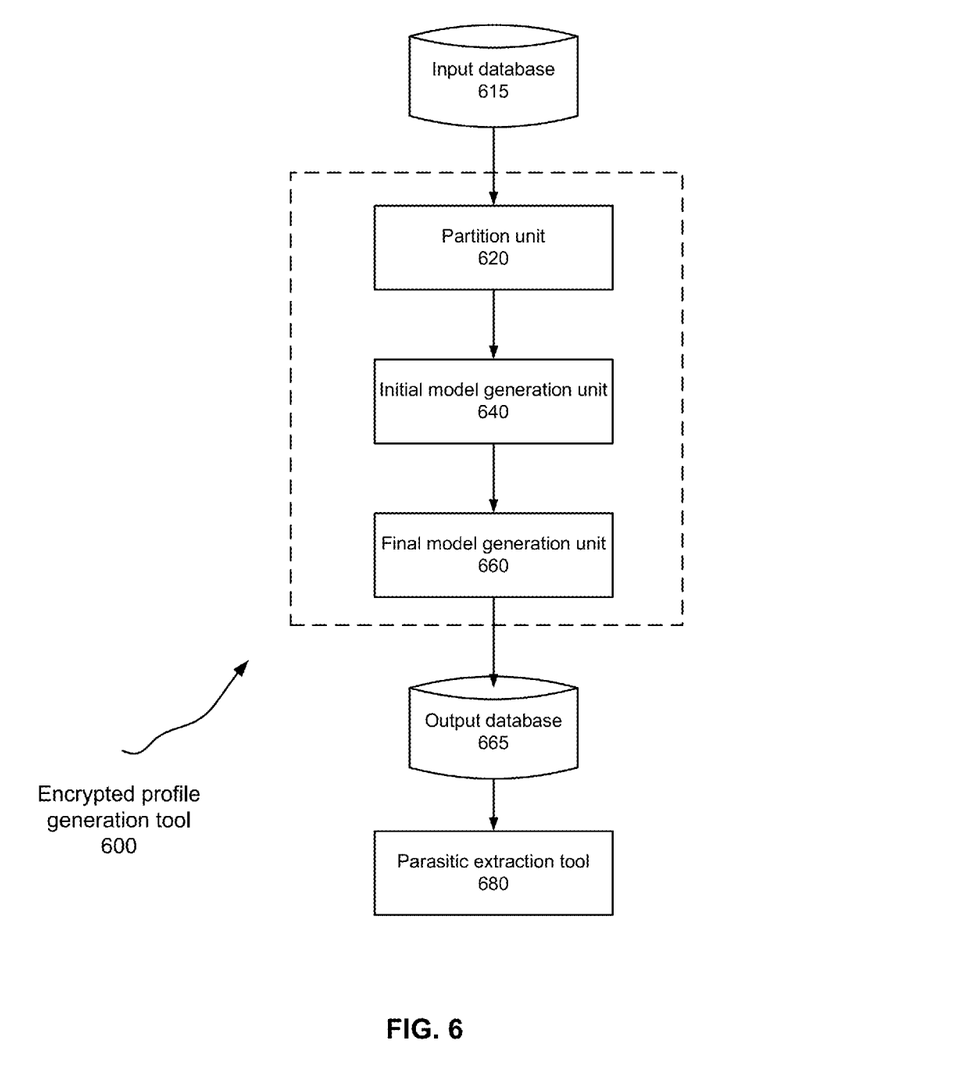
FIG. 6 illustrates an encrypted profile generation tool that may be employed according to various embodiments of the invention.

FIG. 6 illustrates an example of an encrypted profile generation tool according to various embodiments of the invention. As seen in the figure, the encrypted profile generation tool 600 includes four units: a partition unit 620, an initial model generation unit 640, and a final model generation unit 660. As will be discussed in more detail below, some implementations of the encrypted profile generation tool 600 may cooperate with (or incorporate) one or more of an input database 615, an output database 665 and a parasitic extraction tool 680. While the input database 615 and the output database 665 are shown as separate units in FIG. 6, a single data storage medium may be used to implement some or all of these databases.

According to some embodiments of the invention, one or more of the partition unit 620, the initial model generation unit 640, the final model generation unit 660, and the parasitic extraction tool 680 may be implemented by executing programming instructions on one or more programmable computers/computer systems, such as the computing system illustrated in FIG. 2 and FIG. 3. Correspondingly, some other embodiments of the invention may be implemented by software instructions, stored on a non-transitory computer-readable medium, for instructing one or more programmable computers/computer systems to perform the functions of one or more of the partition unit 620, the initial model generation unit 640, the final model generation unit 660, and the parasitic extraction tool 680. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 7:
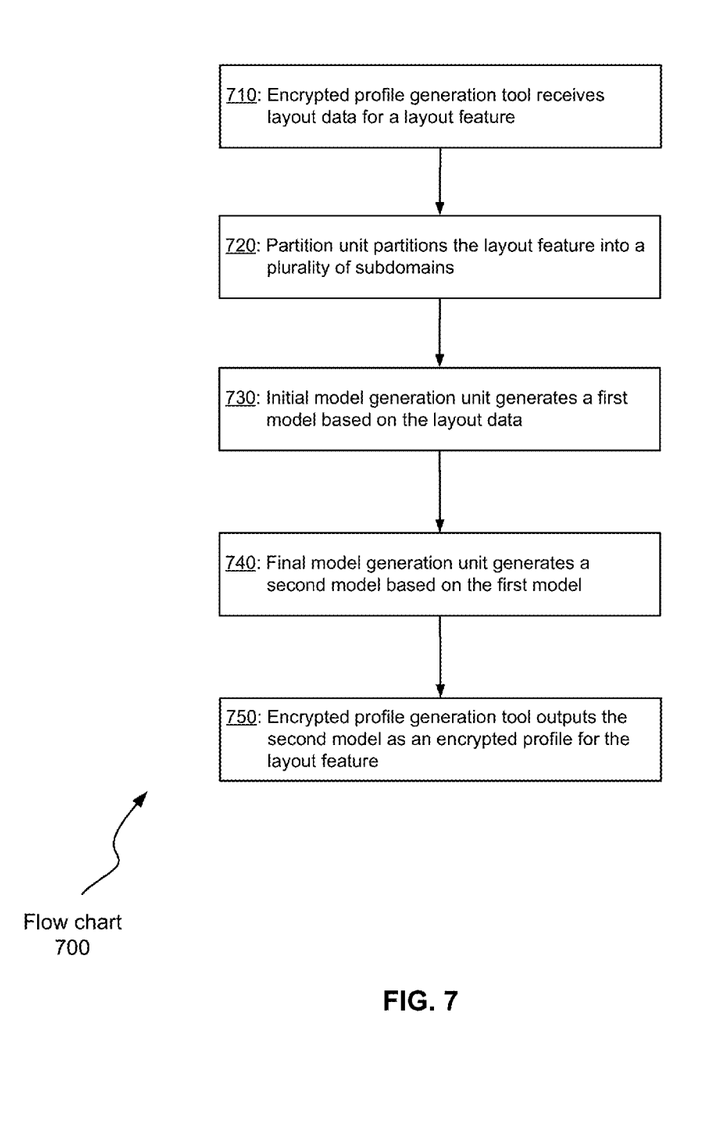
FIG. 7 illustrates a flowchart describing methods for generating encrypted profiles that may be employed by various embodiments of the invention.

For ease of understanding, encrypted profile generation methods that may be employed according to various embodiments of the invention will be described with reference to encrypted profile generation tool 600 illustrated in FIG. 6 and the encrypted profile generation method shown in the flow chart 700 in FIG. 7. It should be appreciated, however, that alternate implementations of an encrypted profile generation tool may be used to perform the encrypted profile generation method shown in the flow chart 700 according to various embodiments of the invention. In addition, it should be appreciated that implementations of the encrypted profile generation tool 600 may be employed with other methods for encrypted profile generation according to different embodiments of the invention.

Initially, in operation 710, the encrypted profile generation tool 600 receives layout design and process profile data for a layout feature for which an encrypted profile or an electrically equivalent model is to be generated. The layout feature may comprise one or more geometric elements corresponding to a portion of or a whole of a device. The device may be a transistor. The gate portion 510 in FIG. 5 is an example of the layout feature.

Next, in operation 720, the partition unit 620 partitions the layout feature into a plurality of subdomains. A subdomain may have various shapes. The finite difference method usually employs rectangular shapes while the finite element method often uses triangular shapes. These subdomains of the layout feature may have the same or different sizes.

The plurality of subdomains are associated with boundary nodes and internal nodes: the boundary nodes may comprise points on the boundary of the layout feature and points on conductors inside the boundary of the layout feature while the internal nodes are points on dielectrics inside the boundary of the layout feature. In FIG. 5, the partition forms a grid. Grid points on the boundary of the gate portion 510 such as nodes 530 and 540 and a grid point on the conductor of the gate (e.g. 570) are boundary nodes while the grid points on dielectrics inside the gate portion 510 such as nodes 550 and 560 are internal nodes.

In operation 730, the initial model generation unit 640 generates, based on the layout data, a first model describing an electric parameter relationship involving both the boundary nodes and the internal nodes. The first model may be in the form of a linear equation system or represented by a matrix. For example, if the electric parameter relationship is a relationship of electric flux vs. electric potential, the first model may be in a form similar to Eq. 5.

To derive the matrix A, the geometric information and the electric susceptibility/conductor information for the boundary nodes and the internal nodes may first be extracted from the layout design and process profile data. Equations such as Eq. 4 may be used to calculate elements of the matrix A.

In operation 740, the final model generation unit 660 generates, based on the first model, a second model describing an electric parameter relationship involving the boundary nodes. In the above example, the final model generation unit 660 may generate the second model by deriving the term ($A_{22}-A_{21}A_{11}^{-1}A_{12}$) from the matrix A.

Various techniques such as the single value decomposition method may be employed to approximate the term ($A_{22}-A_{21}A_{11}^{-1}A_{12}$). In some embodiments, a low rank approximation may be employed.

In operation 760, the encrypted profile generation tool 600 outputs the second model and location information of the boundary nodes as an encrypted profile for the layout feature. The encrypted profile generation tool 600 may store the encrypted profile in a medium such as a non-volatile processor accessible medium. Additionally or alternatively, the encrypted profile generation tool 600 may display the encrypted profile on a medium such as a monitor or print it on paper.

The encrypted profile can be used the parasitic extraction tool 680 to perform high-accuracy parasitic extraction, without revealing the design layout and profile of the devices. When the finite difference method is employed by the parasitic extraction tool 68, for example, the linear system for the encrypted profile will be combined with the linear system for the circuit outside the boundary to form a new linear system.

The parasitic extraction tool 680 will then derive parasitic parameters by solving the new linear system.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of generating encrypted profiles for layout features, comprising:
   with a computer, receiving layout design and process profile data for a layout feature;
   partitioning the layout feature into a plurality of subdomains, the plurality of subdomains being associated with boundary nodes and internal nodes, the boundary nodes comprising points on boundary of the layout feature and points on conductors inside the boundary of the layout feature, the internal nodes being points inside the boundary of the layout feature;
   generating, based on the layout design and process profile data, a first model describing a first electric parameter relationship involving the boundary nodes and the internal nodes;
   generating, based on the first model, a second model describing a second electric parameter relationship involving the boundary nodes; and
   outputting the second model and location information of the boundary nodes as an encrypted profile for the layout feature.

2. The method recited in claim 1, wherein the layout feature comprises one or more geometric elements corresponding to a portion of or a whole of a device.

3. The method recited in claim 2, wherein the device is a transistor.

4. The method recited in claim 3, wherein the portion of the transistor is gate portion of the transistor.

5. The method recited in claim 1, wherein the layout design and process profile data comprising electric susceptibility or permittivity information for dielectric materials in the layout feature and conductor information.

6. The method recited in claim 1, wherein the first model and the second model are finite difference method models.

7. The method recited in claim 1, wherein the first electric parameter relationship and the second electric parameter relationship are relationships of electric field flux vs. electric potential.

8. The method recited in claim 1, further comprising:
   extracting one or more parasitic parameters associated with the layout feature based on the second model.

9. The method recited in claim 8, wherein the one or more parasitic parameters comprise parasitic capacitance.

10. A non-volatile processor-readable medium storing processor-executable instructions for causing one or more processors to perform a method of generating encrypted profiles for layout features, the method comprising:
    receiving layout design and process profile data for a layout feature;
    partitioning the layout feature into a plurality of subdomains, the plurality of subdomains being associated with boundary nodes and internal nodes, the boundary nodes comprising points on boundary of the layout feature and points on conductors inside the boundary of the layout feature, the internal nodes being points inside the boundary of the layout feature;
    generating, based on the layout design and process profile data, a first model describing a first electric parameter relationship involving the boundary nodes and the internal nodes;
    generating, based on the first model, a second model describing a second electric parameter relationship involving the boundary nodes; and
    outputting the second model and location information of the boundary nodes as an encrypted profile for the layout feature.

11. The processor-readable medium recited in claim 10, wherein the layout feature comprises one or more geometric elements corresponding to a portion of or a whole of a device.

12. The processor-readable medium recited in claim 10, wherein the first model and the second model are finite difference method models.

13. The processor-readable medium recited in claim 10, wherein the first electric parameter relationship and the second electric parameter relationship are relationships of electric field flux vs. electric potential.

14. The processor-readable medium recited in claim 10, wherein the method further comprises:
    extracting one or more parasitic parameters associated with the layout feature based on the second model.

15. A system for generating encrypted profiles for layout features, comprising:
    a partition unit configurable to partition a layout feature into a plurality of subdomains, the plurality of subdomains being associated with boundary nodes and internal nodes, the boundary nodes comprising points on boundary of the layout feature and points on conductors inside the boundary of the layout feature, the internal nodes being points inside the boundary of the layout feature;
    an initial model generation unit configurable to generate, based on layout design and process profile data for the layout feature, a first model describing a first electric parameter relationship involving the boundary nodes and the internal nodes;
    a final model generation unit configurable to generate, based on the first model, a second model describing a second electric parameter relationship involving the boundary nodes.

16. The system recited in claim 15, wherein the layout feature comprises one or more geometric elements corresponding to a portion of or a whole of a device.

17. The system recited in claim 15, wherein the first model and the second model are finite difference method models.

18. The system recited in claim 15, wherein the first electric parameter relationship and the second electric parameter relationship are relationships of electric field flux vs. electric potential.

19. The system recited in claim 15, wherein the method further comprises:
    extracting one or more parasitic parameters associated with the layout feature based on the second model.

* * * * *